United States Patent (10) Patent No.: US 7,560,758 B2
Zhu et al. (45) Date of Patent: Jul. 14, 2009

(54) MOSFETS COMPRISING SOURCE/DRAIN RECESSES WITH SLANTED SIDEWALL SURFACES, AND METHODS FOR FABRICATING THE SAME

(75) Inventors: Huilong Zhu, Poughkeepsie, NY (US); Hong Lin, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/427,491

(22) Filed: Jun. 29, 2006

(65) Prior Publication Data

US 2008/0001260 A1 Jan. 3, 2008

(51) Int. Cl.
*H01L 29/80* (2006.01)
(52) U.S. Cl. ............... 257/288; 257/382; 257/E29.143; 257/622; 257/902
(58) Field of Classification Search ................. 257/347, 257/902, 382, 384, E29.143, 622, 288
See application file for complete search history.

(56) References Cited

U.S. PATENT DOCUMENTS

| | | | |
|---|---|---|---|
| 4,877,749 A * | 10/1989 | Quigg | 438/274 |
| 5,323,053 A * | 6/1994 | Luryi et al. | 257/485 |
| 5,365,531 A | 11/1994 | Lin et al. | |
| 5,436,925 A | 7/1995 | Lin et al. | |
| 5,448,579 A | 9/1995 | Chang et al. | |
| 5,449,932 A | 9/1995 | Fujii | |
| 5,491,712 A | 2/1996 | Lin et al. | |
| 5,838,708 A | 11/1998 | Lin et al. | |
| 5,972,762 A | 10/1999 | Wu | |
| 6,097,741 A | 8/2000 | Lin et al. | |
| 6,100,159 A * | 8/2000 | Krivokapic | 438/413 |
| 6,292,549 B1 | 9/2001 | Lung et al. | |
| 6,373,867 B1 | 4/2002 | Lin et al. | |
| 6,420,218 B1 | 7/2002 | Yu | |
| 6,480,756 B1 | 11/2002 | Luh et al. | |
| 6,493,439 B2 | 12/2002 | Lung et al. | |
| 6,570,892 B1 | 5/2003 | Lin et al. | |
| 6,743,669 B1 | 6/2004 | Lin et al. | |

(Continued)

OTHER PUBLICATIONS

C.-H. Jan et al., "A 65nm Ultra Low Power Logic Platform Technology using Uni-axial Strained Silicon Transistors". Logic Technology Department, Intel Corporation, Hillsboro, OR, USA. 2005 IEEE, 4 pages.

(Continued)

*Primary Examiner*—Thanh V Pham
*Assistant Examiner*—Mohammad T Karimy
(74) *Attorney, Agent, or Firm*—Scully, Scott, Murphy & Presser, P.C.; Joseph P. Abate, Esq.

(57) ABSTRACT

The present invention relates to improved metal-oxide-semiconductor field effect transistor (MOSFET) devices with stress-inducing structures located at the source and drain (S/D) regions. Specifically, each MOSFET comprises source and drain regions located in a semiconductor substrate. Such source and drain regions comprise recesses with one or more sidewall surfaces that are slanted in relation to an upper surface of the semiconductor substrate. A stress-inducing dielectric layer is located over the slanted sidewall surfaces of the recesses at the source and drain regions. Such MOSFETs can be readily formed by crystallographic etching of the semiconductor substrate to form the recesses with the slanted sidewall surfaces, followed by deposition of a stress-inducing dielectric layer thereover.

11 Claims, 8 Drawing Sheets

U.S. PATENT DOCUMENTS

| | | |
|---|---|---|
| 6,746,925 B1 | 6/2004 | Lin et al. |
| 6,794,304 B1 | 9/2004 | Gu et al. |
| 6,841,831 B2 | 1/2005 | Hanafi et al. |
| 6,845,108 B1 | 1/2005 | Liu et al. |
| 6,864,152 B1 | 3/2005 | Mirbedini et al. |
| 6,939,751 B2 * | 9/2005 | Zhu et al. .................. 438/151 |
| 2002/0064264 A1 | 5/2002 | Lung et al. |
| 2003/0040158 A1* | 2/2003 | Saitoh ........................ 438/279 |
| 2004/0195646 A1* | 10/2004 | Yeo et al. .................... 257/527 |
| 2005/0054210 A1 | 3/2005 | Lu et al. |
| 2005/0090066 A1 | 4/2005 | Zhu et al. |
| 2005/0189589 A1 | 9/2005 | Zhu et al. |
| 2006/0011994 A1 | 1/2006 | Lin et al. |

OTHER PUBLICATIONS

Jan et al. "A 65nm Low Power Logic Platform Technology Using Uni-Axial Strained Silicon Transistors," IEEE, 2005.

* cited by examiner

MOSFETS COMPRISING SOURCE/DRAIN RECESSES WITH SLANTED SIDEWALL SURFACES, AND METHODS FOR FABRICATING THE SAME

FIELD OF THE INVENTION

The present invention relates to semiconductor devices that can be used in complementary metal-oxide-semiconductor (CMOS) circuits. More specifically, the present invention relates to an improved metal-oxide-semiconductor field effect transistor (MOSFET) comprising source and drain (S/D) recesses with slanted sidewall surfaces and a stress-inducing dielectric layer that is located over the slanted sidewall surfaces of such recesses, as well as methods for forming such S/D recesses by crystallographic etching.

BACKGROUND OF THE INVENTION

Mechanical stresses within a semiconductor device substrate have been widely used to modulate device performance. For example, in silicon, hole mobility is enhanced when the channel film is under compressive stress in electrical current direction and/or under tensile stress in a direction normal of the silicon film, while the electron mobility is enhanced when the silicon film is under tensile stress in electrical current direction and/or under compressive stress in the direction normal of the silicon film. Therefore, compressive and/or tensile stresses can be advantageously created in the channel regions of a p-channel field effect transistor (p-FET) and/or an n-channel field effect transistor (n-FET) in order to enhance the performance of such devices.

One possible approach for creating a desirable stressed silicon channel region is to cover the FET devices with compressively and/or tensilely stressed dielectric films, such as silicon nitride films. For example, U.S. Patent Application Publication No. 2003/0040158 published on Feb. 27, 2003 for "SEMICONDUCTOR DEVICE AND METHOD OF FABRICATING THE SAME" describes a semiconductor device that contains a first tensilely stressed nitride layer overlaying the channel region of an n-MOSFET, and a second compressively stressed nitride layer overlaying the channel region of a p-MOSFET, for respective application of tensile and compressive stresses to the n-MOSFET and p-MOSFET. However, such overlaying stressed nitride layers can only create a limited amount of stress in the channel regions of the MOSFET devices.

Recessed source and drain regions have been used in conjunction with the stressed nitride layers to improve the stress profile in the MOSFET channel region. Specifically, the source and drain regions of the MOSFET devices are etched back to form recesses with vertical sidewalls and a substantially flat bottom surface. A stressed nitride layer, which is formed not only on top of the MOSFET channel region but also in the source and drain recesses and over the vertical sidewalls of the MOSFET channel region, is significantly more effective in creating stress in the channel regions, in comparison with a similar nitride layer that is formed only on top of the MOSFET channel regions. However, such recessed source and drain regions with vertical sidewalls undercut the source and drain extension regions in the MOSFET, which leads to increased short channel effects, increased junction leakage, and deteriorated device performance.

There is therefore a need for improved MOSFET device structures with enhanced stress profile in the channel regions, without increasing the short channel effects and the junction leakage of the MOSFETs.

SUMMARY OF THE INVENTION

The inventors of the present invention have discovered that source and drain recesses with slanted sidewall surfaces can be used in conjunction with an overlaying stress-inducing dielectric layer to create more stress in the channel regions of MOSFET device structures. The slanted sidewall surfaces of the source and drain recesses function to minimize the undercut in the source and drain extension regions of the MOSFET device structures, which in turn minimizes the short channel effects and the junction leakage in the MOSFETs.

In one aspect, the present invention relates to a semiconductor device comprising a metal-oxide-semiconductor field effect transistor (MOSFET) having source and drain regions that are located in a semiconductor substrate. The source and drain regions comprise recesses with one or more sidewall surfaces that are slanted in relation to an upper surface of the semiconductor substrate. A stress-inducing dielectric layer is located over the slanted sidewall surfaces of the recesses at the source and drain regions.

Preferably, but not necessarily, the stress-inducing dielectric layer comprises tensilely or compressively stressed silicon nitride.

The upper surface of the semiconductor substrate is preferably oriented along one of a first set of equivalent crystal planes, and the one or more sidewall surfaces of the recesses are preferably oriented along a second, different set of equivalent crystal planes.

In single crystal semiconductor materials, all lattice directions and lattice planes in a unit cell of a single crystal material can be described by a mathematical description known as a Miller Index. On one hand, the notation [hkl] in the Miller Index defines a crystal direction or orientation, such as the [001], [100], [010], [110], and [111] directions in a cubic unit cell of single crystal silicon. On the other hand, the crystal planes or facets of a single crystal silicon unit cell are defined by the notation (hkl) in Miller Index, which refers to a particular crystal plane or facet that is perpendicular to the [hkl] direction. For example, the crystal planes (100), (110), and (111) of the single crystal silicon unit cells are respectively perpendicular to the [100], [110], and [111] directions. Moreover, because the unit cells are periodic in a semiconductor crystal, there exist families or sets of equivalent crystal directions and planes. The notation <hkl> in the Miller Index therefore defines a family or set of equivalent crystal directions or orientations. For example, the <100> directions include the equivalent crystal directions of [100], [010], and [001]; the <110> directions include the equivalent crystal directions of [110], [011], [101], [-1-10], [0-1-1], [-10-1], [-110], [0-11], [-101], [1-10], [01-1], and [10-1]; and the <111> directions include the equivalent crystal directions of [111], [-111], [1-11], and [11-1]. Similarly, the notation {hkl} defines a family or set of equivalent crystal planes or facets that are respectively perpendicular to the <hkl> directions. For example, the {100} planes include the set of equivalent crystal planes that are respectively perpendicular to the <100> directions.

Correspondingly, the term "equivalent crystal planes" as used in the present invention refers to a family of equivalent crystal planes or facets as defined by the Miller Indexes, as described hereinabove.

In a specific embodiment of the present invention, the semiconductor substrate comprises single crystal silicon, and the first and second sets of equivalent crystal planes are selected from the group consisting of the {100}, {110}, and {111} planes of silicon.

In a specific embodiment of the present invention, the MOSFET is a p-channel MOSFET. Correspondingly, the upper surface of the semiconductor substrate is oriented along one of the {110} planes of silicon, and the one or more sidewall surfaces of the recesses are oriented along the {111} planes of silicon.

In an alternative embodiment of the present invention, the MOSFET is an n-channel MOSFET. The upper surface of the semiconductor substrate is oriented along one of the {100} planes of silicon, and the one or more sidewall surfaces of the recesses are oriented along the {111} planes of silicon.

The source and drain recesses as mentioned hereinabove can have either a trapezoidal cross-section, i.e., with a bottom surface that is parallel to the upper surface of the semiconductor substrate, or a triangular cross-section, i.e., without any bottom surface.

In a particularly preferred, but not necessary, embodiment of the present invention, the source and drain regions of the MOSFET further comprise metal silicide layers located over the slanted sidewall surfaces of the recesses but under the stress-inducing dielectric layer.

The semiconductor substrate as mentioned hereinabove may have a semiconductor-on-insulator (SOI) configuration, i.e., it may comprise (from bottom to top) a base semiconductor substrate layer, a buried insulator layer, and a semiconductor device layer. The recesses are located in the semiconductor device layer. Alternatively, the semiconductor substrate may comprise a bulk semiconductor structure with the recesses located therein.

In another aspect, the present invention relates to a method for forming a semiconductor device. Such a method comprises:

crystallographically etching a semiconductor substrate at selected source and drain regions of a MOSFET to form recesses therein, wherein the recesses comprise one or more sidewall surfaces that are slanted in relation to an upper surface of the semiconductor substrate; and forming a stress-inducing dielectric layer over the slanted sidewall surfaces of the recesses at the source and drain regions of the MOSFET.

Preferably, the method further comprises forming metal silicide layers over the slanted sidewall surfaces of the recesses at the source and drain regions of the MOSFET before formation of the stress-inducing dielectric layer.

Preferably, the crystallographic etching is carried out by a wet etching step that employs an etchant selected from the group consisting of ammonia, tetramethylammonium hydroxide, potassium hydroxide, ethylenediamine pyrocatechol (EDP), and a combination thereof. These etchants are effective and highly selective for silicon etching, and they can etch silicon along all crystallographic directions, but at different etching rates along different directions. The different etching rates along different crystallographic directions are caused by the crystalline structure of silicon, i.e., some crystal orientations are more resistant to etching than others. The typical pyramid shapes or V-grooves are produced in a <100>-oriented silicon wafer by one of the above-mentioned etchants, when the etching reaction proceeds in the <100> direction and stops when the etching front hits the {111}-planes.

Other aspects, features and advantages of the invention will be more fully apparent from the ensuing disclosure and appended claims.

DETAILED DESCRIPTION OF THE INVENTION, AND PREFERRED EMBODIMENTS THEREOF

In the following description, numerous specific details are set forth, such as particular structures, components, materials, dimensions, processing steps and techniques, in order to provide a thorough understanding of the present invention. However, it will be appreciated by one of ordinary skill in the art that the invention may be practiced without these specific details. In other instances, well-known structures or processing steps have not been described in detail in order to avoid obscuring the invention.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

The present invention provides source and drain (S/D) recesses with slanted sidewall surfaces, which can be used in conjunction with a stress-inducing dielectric layer to improve the stress profile in the channel region of a MOSFET device, but without increasing the short channel effects and the junction leakage of the MOSFET device. Specifically, the S/D recesses have sidewall surfaces that are tilted or slanted with respect to an upper surface of the semiconductor substrate in which the S/D recesses are located.

Figure 1:
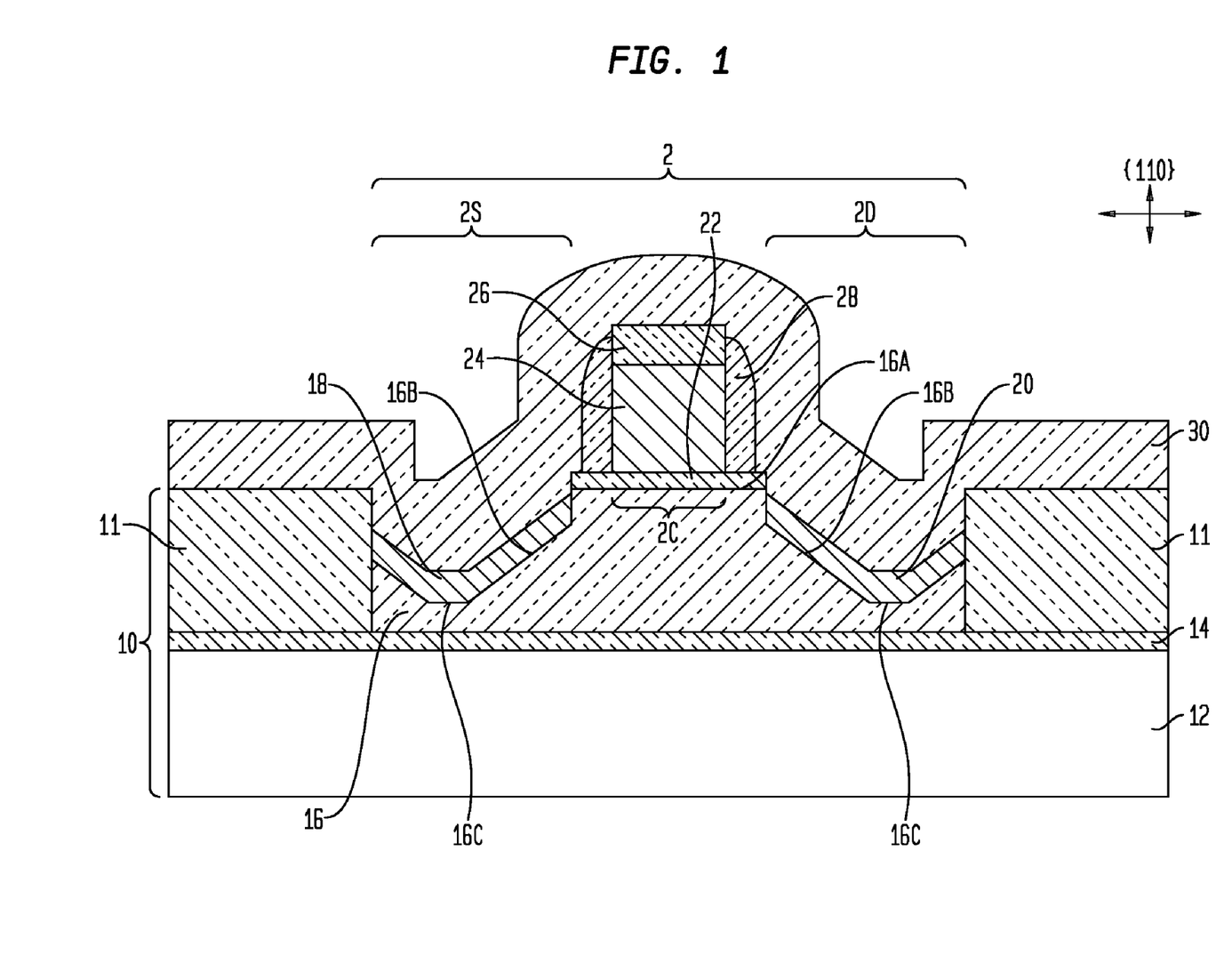
FIG. 1 shows a cross-sectional view of an improved MOSFET device having trapezoidal source and drain (S/D) recesses with slanted sidewall surfaces and a stress-inducing dielectric layer located over the slanted sidewall surfaces of such trapezoidal S/D recesses, according to one embodiment of the present invention.

FIG. 1 shows a cross-sectional view of an improved MOSFET 2 that has source region 2S, drain region 2D, and channel region 2C located in a semiconductor substrate 10. The semiconductor substrate 10 has a semiconductor-on-insulator (SOI) configuration and comprises, from bottom to top, a base semiconductor substrate layer 12, a buried insulator layer 14, and a semiconductor device layer 16. Isolation regions 11 are provided in the semiconductor substrate 10 to isolate the MOSFET 2 from adjacent devices.

The semiconductor device layer 16 contains trapezoidal surface recesses that are located at the source and drain (S/D) regions 2S and 2D. Each of such trapezoidal S/D recesses has sidewall surfaces 16B that are slanted or tilted with respect to an upper surface 16A of the semiconductor device layer 16 and a substantially flat bottom surface 16C that is parallel to the upper surface 16A of the semiconductor device layer 16. Optional metal silicide layers 18 and 20 can be formed over the sidewall surfaces 16B and bottom surfaces 16C of the trapezoidal S/D recesses.

The channel region 2C is located in the semiconductor device layer 16 between the S/D regions 2S and 2D. No recess is formed at the channel region 2C. Instead, a gate stack comprising a gate dielectric layer 22, a gate conductor 24, an optional gate silicide layer 26, and optional spacers 28 is formed over the upper surface 16A of the semiconductor device layer 16 at the channel region 2C.

A stress-inducing dielectric layer 30 is formed over the entire structure, including the slanted sidewall surfaces 16B of the trapezoidal S/D recesses. Such stress-inducing dielectric layer 30 may comprise either tensile or compressive stress for correspondingly applying tensile or compressive stress to the channel region 2C of the MOSFET 2.

On one hand, the trapezoidal S/D recesses with the slanted sidewall surfaces 16B improves the stress profile created in the channel region 2C of the MOSFET 2 by the stress-inducing dielectric layer 30. On the other hand, the trapezoidal S/D recesses do not undercut the source/drain extension regions of the MOSFET 2 (which are typically located under the spacers 28 and extend into the channel region 2C) and therefore do not increase the short channel effects or the leakage current in the MOSFET 2.

Figure 2:
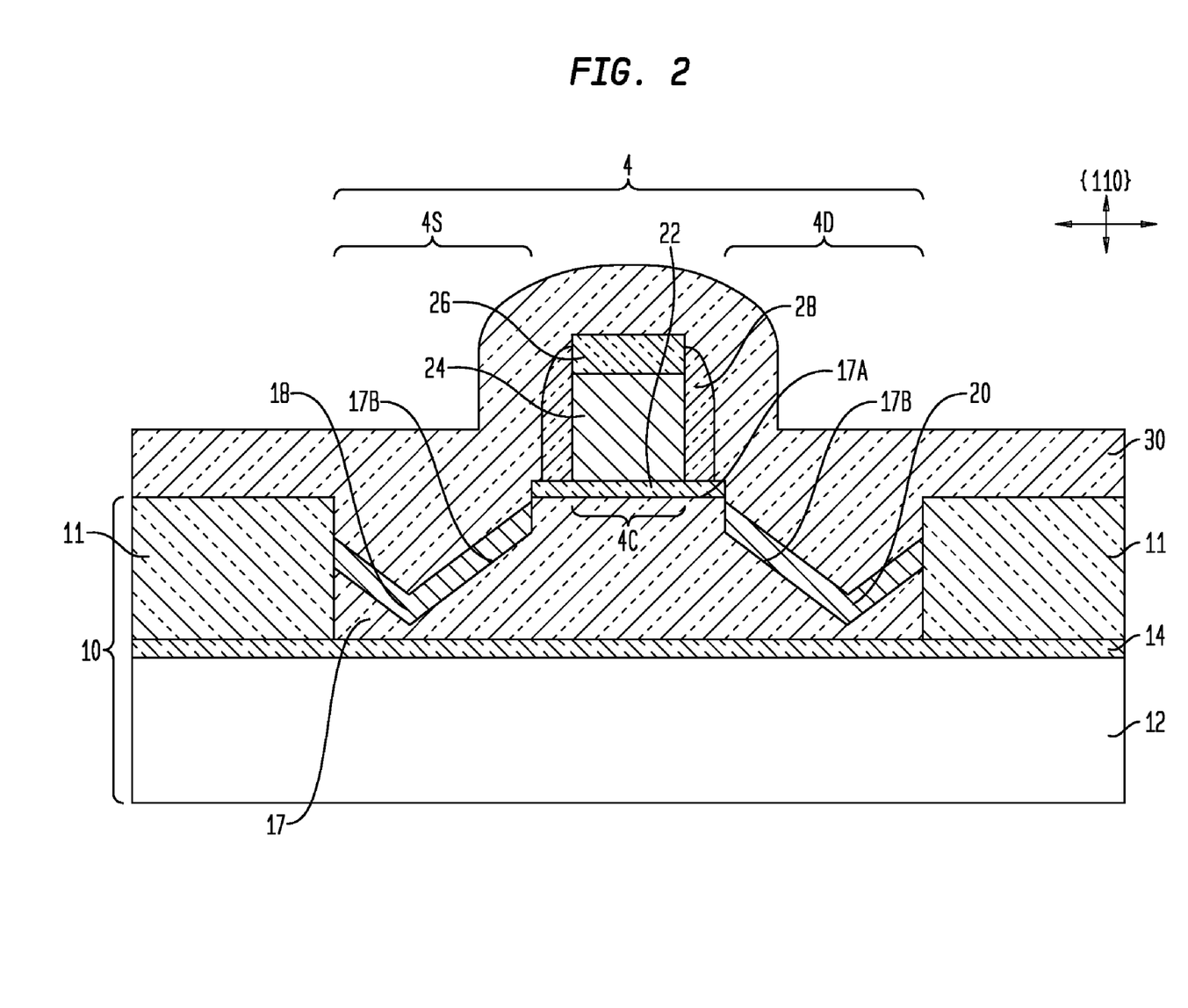
FIG. 2 shows a cross-sectional view of an improved MOSFET device having triangular source and drain (S/D) recesses with slanted sidewall surfaces and a stress-inducing dielectric layer located over the slanted sidewall surfaces of such triangular S/D recesses, according to one embodiment of the present invention.

Similarly, FIG. 2 shows a cross-sectional view of another MOSFET device 4 that is similar to that shown in FIG. 1, except that it contains triangular (instead of trapezoidal) S/D recesses in the semiconductor device layer 17. Each of the triangular S/D recesses have sidewall surfaces 17B that are slanted away from the upper surface 17A of the device layer 17, but without any flat bottom surface. The stress-inducing dielectric layer 30 is located over the slanted sidewall surfaces 17B of such triangular S/D recesses for applying stress (either tensile or compressive) to the channel region 4C of the MOSFET 4.

The triangular S/D recesses as shown in FIG. 2 also improve the stress profile created in the channel region 4C of the MOSFET 4 by the stress-inducing dielectric layer 30, but without increasing the short channel effects or the leakage current in the MOSFET 4.

Specifically, the MOSFET 2 has S/D regions 2S, 2D and a channel region 2C located in a semiconductor substrate 10 and between isolation regions 12. A gate stack that comprises a gate dielectric layer 22, a gate conductor 24, a dielectric cap layer 26, and optional sidewall spacers 27 and 28 is formed over the channel region 2C.

In a preferred embodiment of the present invention, the semiconductor device layers 16 and 17 as shown in FIGS. 1-2 comprise single crystal silicon, and their upper surfaces 16A and 17B are oriented along the {110} planes of silicon. In this manner, the MOSFETs 2 and 4 are preferably p-channel MOSFETs, so that the channel regions 2C and 4C of such p-channel MOSFETs 2 and 4 are oriented along the {110} planes of silicon, which function to enhance the hole mobility in the channel regions 2C and 4C. Further, it is preferred that the stress-inducing dielectric layer 30 overlaying the S/D recesses contain intrinsic compressive stress, which is in turn applied to the channel regions 2C and 4C for further enhancing the hole mobility.

In an alternative embodiment of the present invention, the semiconductor device layers 16 and 17 as shown in FIGS. 1-2 comprise single crystal silicon, and their upper surfaces 16A and 17B are oriented along the {100} planes of silicon. In this manner, the MOSFETs 2 and 4 are preferably n-channel MOSFETs, so that the channel regions 2C and 4C of such n-channel MOSFETs 2 and 4 are oriented along the {100} planes of silicon, which function to enhance the electron mobility in the channel regions 2C and 4C. The stress-inducing dielectric layer 30 overlaying the S/D recesses preferably contain intrinsic tensile stress, which is in turn applied to the channel regions 2C and 4C for further enhancing the electron mobility.

The S/D recesses as shown in FIGS. 1-2 can be readily formed by crystallographic etching, which etches the semiconductor substrate 10 along all crystallographic directions, but at significantly different rates along different crystal planes or orientations. Therefore, the etch pattern formed by such a crystallographic etching process proceeds along the fast-etched crystal planes and is eventually terminated by the slowly-etched crystal planes. For example, when the semiconductor device layers 16 and 17 of FIGS. 1-2 have upper surfaces 16A and 17A oriented along the {110} planes of silicon, the crystallographic etching can be carried out using an ammonia- or tetramethyl ammonium hydroxide-based etching solution, which etches the {110} planes at a much faster rate than along the {111} planes. Therefore, the etch pattern so formed will terminate by the slowly-etched {111} crystal planes, which are slanted away from the {110} planes and thereby form the slanted sidewall surfaces 16B and 17B of the S/D recesses.

FIGS. 3-6 illustrate exemplary processing steps that can be used for fabricating the MOSFET device of FIG. 1, according to one embodiment of the present invention.

Figure 3:
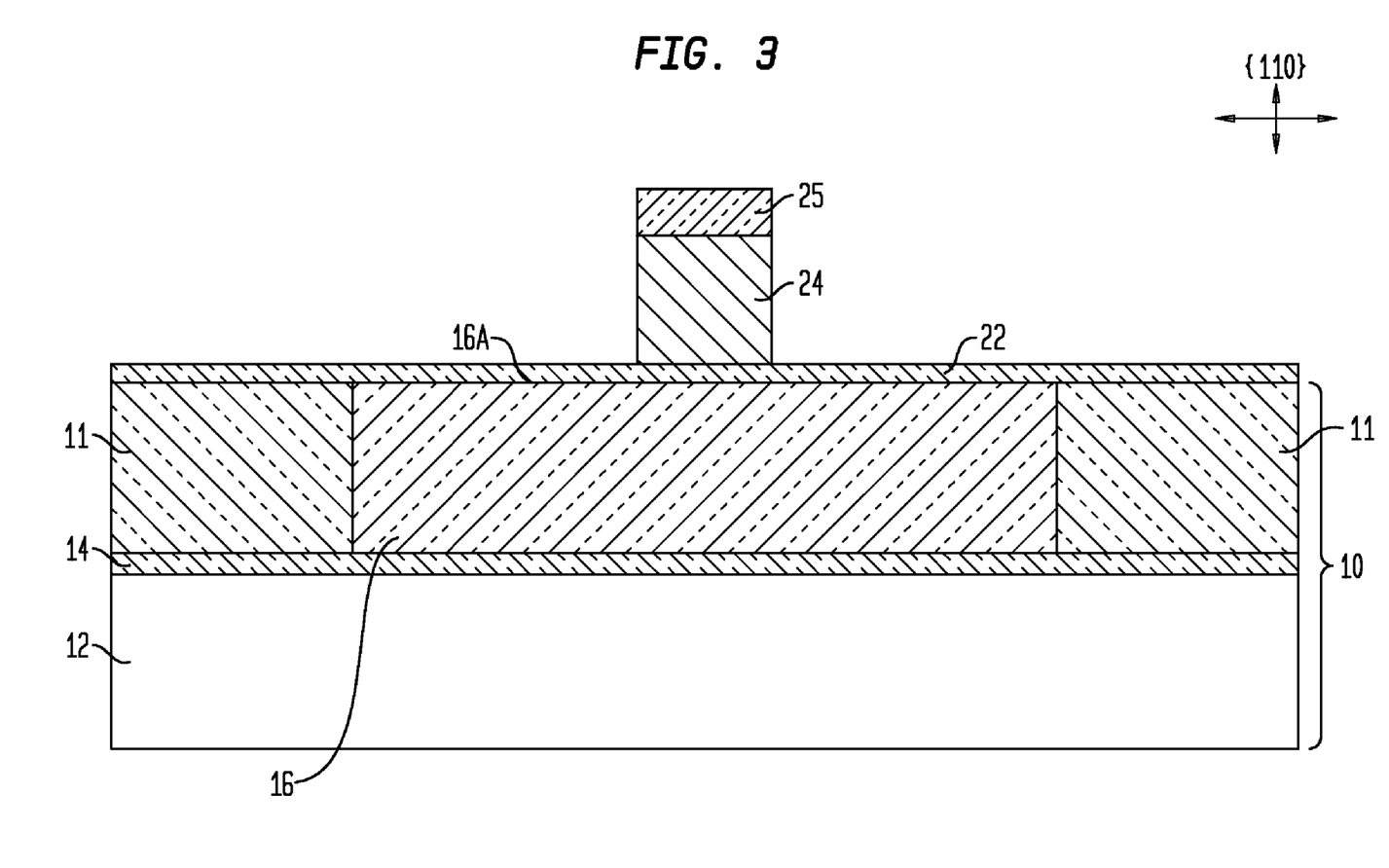
FIGS. 3-6 are cross-sectional views that illustrate exemplary processing steps for forming the improved MOSFET device of FIG. 1, according to one embodiment of the present invention.

First, a gate dielectric layer 22 is formed over a semiconductor substrate 10, as shown in FIG. 3. A pattern gate stack, which comprises a gate conductor 24 and a dielectric cap layer 25, is formed over the gate dielectric layer 22.

The semiconductor substrate 10 may comprise a bulk semiconductor structure, or it may has a semiconductor-on-insulator (SOI) configuration with a base semiconductor substrate layer 12, a buried insulator layer 14, and a semiconductor device layer 16, as shown in FIG. 3.

The base semiconductor substrate layer 12 may comprise any suitable single crystal semiconductor material, which includes, but is not limited to: Si, SiC, SiGe, SiGeC, Ge alloys, GaAs, InAs, InP, as well as other III-V or II-VI compound semiconductors. The base semiconductor substrate layer 12 may also comprise a layered semiconductor such as Si/SiGe, a silicon-on-insulator (SOI) or a SiGe-on-insulator (SGOI). Preferably, the base semiconductor substrate layer 12 is composed of a Si-containing semiconductor material, i.e., a semiconductor material that includes silicon. More preferably, the base semiconductor substrate layer 12 consists essentially of bulk single crystal silicon. Alternatively, the base semiconductor substrate layer 12 may comprise one or more buried insulator layers (not shown) therein. The base semiconductor substrate layer 12 may be doped, undoped or contain both doped and undoped regions (not shown) therein.

The buried insulator layer 14 may comprise any suitable insulator material(s), and it typically comprises an oxide, a nitride, or an oxynitride in either a crystalline phase or a non-crystalline phase. The physical thickness of the buried insulator layer 14 typically ranges from about 10 nm to about 400 nm, and more typically from about 20 nm to about 200 nm.

The semiconductor device layer 16 may comprise any single crystal semiconductor material, which includes, but is not limited to: Si, SiC, SiGe, SiGeC, Ge alloys, GaAs, InAs, InP, as well as other III-V or II-VI compound semiconductors. Preferably, the semiconductor device layer 16 is composed of a Si-containing semiconductor material, i.e., a semiconductor material that includes silicon. More preferably, the semiconductor device layer 16 consists essentially of single crystal silicon and has an upper surface 16A that is oriented along one of a first set of equivalent crystal planes of silicon. In one specific embodiment of the present invention, the upper surface 16A of the semiconductor device layer 16 is oriented along one of the {110} planes of silicon, as shown by the arrowheads in FIG. 3, so that the semiconductor device layer 16 can be used for forming a channel region for a p-FET device. In an alternative embodiment of the present invention, the upper surface 16A of the semiconductor device layer 16 is oriented along one of the {100} planes of silicon (not shown), so that the semiconductor device layer 16 can be used for forming a channel region for an n-FET device. Note that the semiconductor device layer 16 and the base semiconductor substrate layer 12 may be formed of the same semiconductor material or different types of semiconductor materials.

The SOI substrate structure 10 as shown in FIG. 3 can be formed in situ by depositing the buried insulator layer 14 over the base semiconductor substrate layer 12 via chemical vapor deposition, thermal oxidation or a combination thereof, followed by deposition of the semiconductor device layer 16. Alternatively, the SOI substrate structure 10 of FIG. 3 can be formed in situ by a silicon implanted oxide (SIMOX) process, during which oxygen ions are implanted into a bulk semiconductor substrate at a predetermined depth, followed by high temperature anneal to effectuate reaction between the semiconductor material and the implanted oxygen ions, thereby forming an oxide layer in the semiconductor substrate at the predetermined depth. Further, the SOI substrate structure 10 of FIG. 3 may be fabricated from pre-formed insulator and semiconductor layers by wafer-bonding or layer transfer techniques.

At least one isolation region, such as, for example, the trench isolation region 11, can be provided in the semiconductor device layer 16 of the SOI substrate 10 to isolate the device region for the MOSFET 2 from the adjacent device regions. The isolation region may be a trench isolation region 11 (as shown in FIG. 3) or a field oxide isolation region. The trench isolation region 11 is formed utilizing a conventional trench isolation process well known to those skilled in the art. For example, lithography, etching and filling of the trench with a trench dielectric may be used in forming the trench isolation region 11. Optionally, a liner may be formed in the trench prior to trench fill, a densification step may be performed after the trench fill and a planarization process may follow the trench fill as well. The field oxide may be formed utilizing a so-called local oxidation of silicon process.

The gate dielectric layer 22 of the present invention may be comprised of any suitable dielectric material, including, but not limited to: oxides, nitrides, oxynitrides and/or silicates (including metal silicates and nitrided metal silicates). In one embodiment, it is preferred that the gate dielectric layer 22 is comprised of an oxide such as, for example, $SiO_2$, $HfO_2$, $ZrO_2$, $Al_2O_3$, $TiO_2$, $La_2O_3$, $SrTiO_3$, $LaAlO_3$, and mixtures thereof. The physical thickness of the gate dielectric layer 22 may vary widely, depending on the specific deposition technique employed. Typically, the gate dielectric layer 24 has a thickness from about 0.5 to about 10 nm, with a thickness from about 1 to about 5 nm being more typical. The gate dielectric layer 22 can be formed by a thermal growing process such as, for example, oxidation, nitridation or oxynitridation. Alternatively, the gate dielectric layer 22 can be formed by a deposition process such as, for example, chemical vapor deposition (CVD), plasma-assisted CVD, atomic layer deposition (ALD), evaporation, reactive sputtering, chemical solution deposition and other like deposition processes. The gate dielectric layer 22 may also be formed utilizing any combination of the above processes.

The patterned gate stack, which comprises the gate conductor 24 and the optional dielectric cap layer 25, is formed over the gate dielectric layer 22, by first depositing a blanket gate conductor layer (not shown) and a blanket dielectric capping layer (not shown) over the gate dielectric layer 22, followed by patterning the blanket gate conductor layer (not shown) and the dielectric capping layer (not shown) into the gate conductor 24 and the optional dielectric cap layer 25 using conventional lithography and etching. The lithographic step, preferably inverse gate level (PC) lithography, includes applying a photoresist (not shown) to the upper surface of the blanket dielectric capping layer (not shown), exposing the photoresist (not shown) to a desired pattern of radiation and developing the exposed photoresist (not shown) utilizing a conventional resist developer. The pattern in the photoresist (not shown) is then transferred to the underneath dielectric capping layer (not shown), the blanket gate conductor layer (not shown), and the blanket gate dielectric layer (not shown) utilizing one or more dry etching steps. Suitable dry etching processes that can be used in the present invention include, but are not limited to: reactive ion etching (RIE), ion beam etching, plasma etching or laser ablation. Preferably, but not necessarily, the gate conductor layer 24 comprises polycrystalline silicon (poly-Si), and the dielectric cap layer 25 comprises silicon nitride. The etching step preferably is carried out by RIE techniques. The patterned photoresist (not shown) is then removed by resist stripping after etching has been completed.

Conventional dopant implantation can then be conducted to form S/D extension regions (not shown) and halo regions (not shown) in the semiconductor device layer 16 using the patterned gate stack as a mask. Alternatively, the S/D extension and halo implantation can be performed after the crystallographic etching step.

Figure 4:
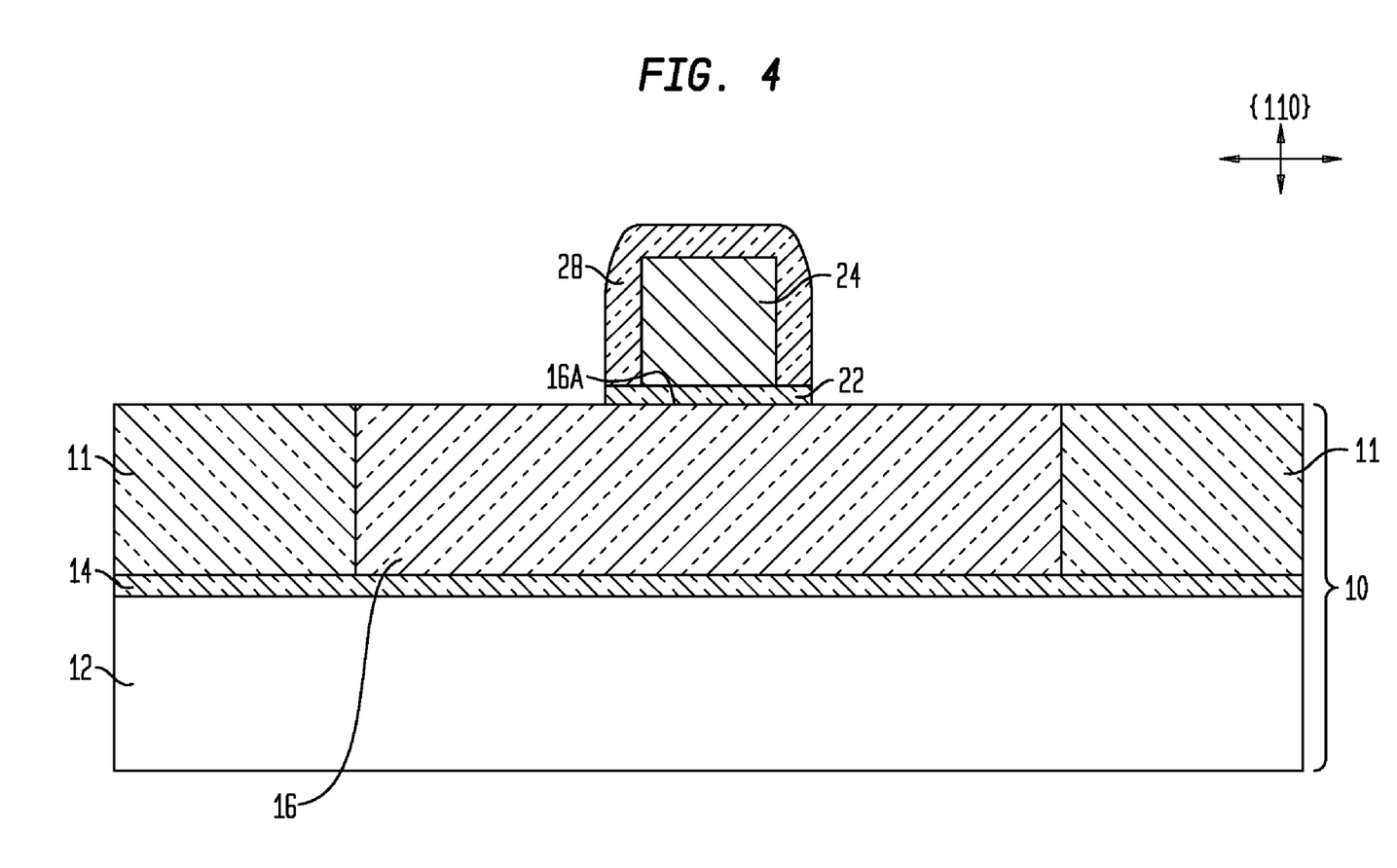

Subsequently, a blanket dielectric layer (not shown) can be deposited over the entire structure and then patterned into dielectric spacers 28 along sidewalls of the gate stack, as shown in FIG. 4. Preferably, the dielectric spacers 28 are formed from a blanket silicon nitride layer and are patterned by reactive ion etching (RIE). The dielectric spacers 28 may merge with the dielectric cap layer 25 located atop the gate conductor 24 to form a continuous dielectric structure that covers the entire gate conductor 24.

Figure 5:
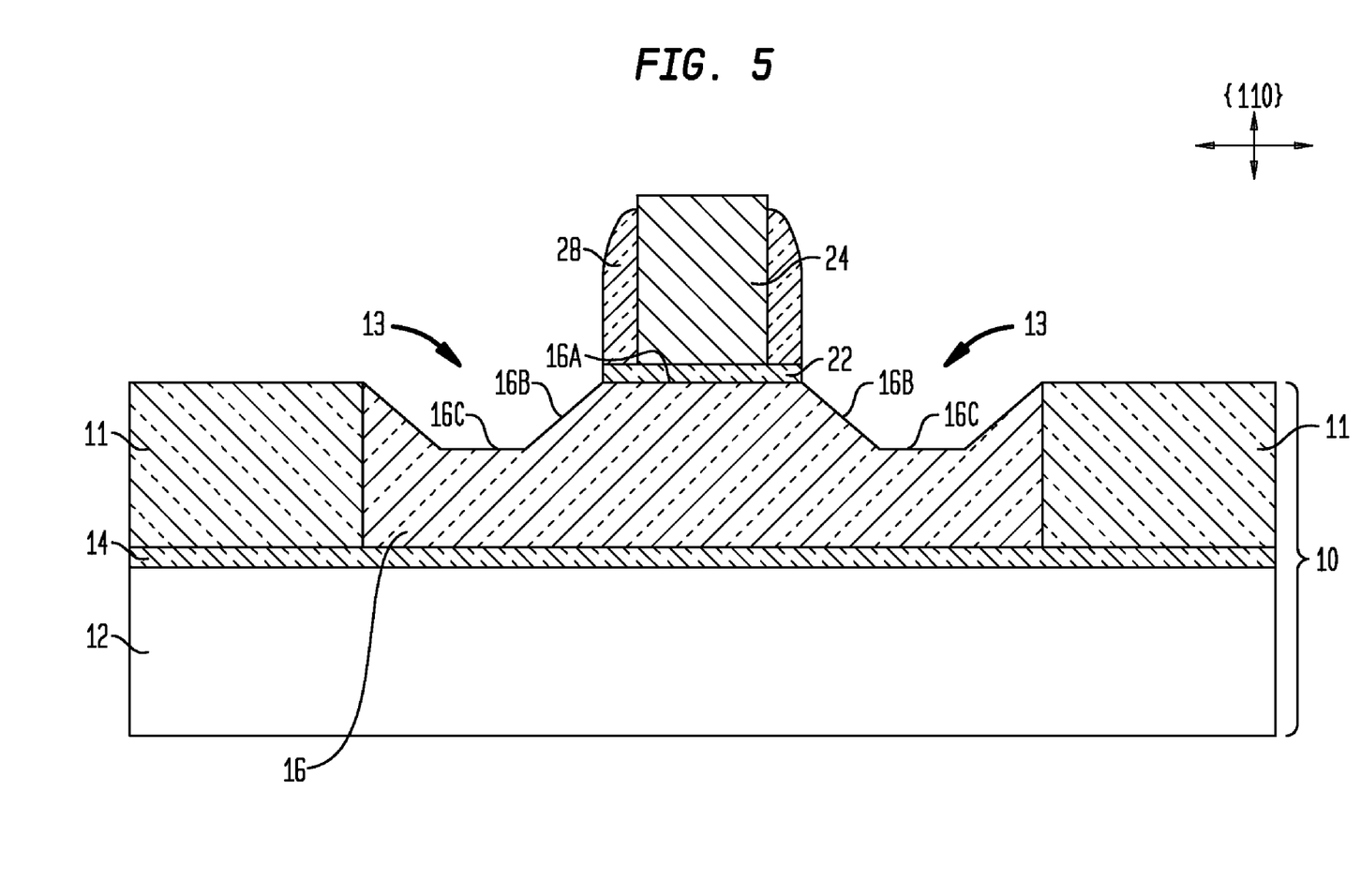

After formation of the dielectric spacer 28, a crystallographic etching process is carried to form surface recesses 13 in the semiconductor device layer 16 at regions adjacent to the gate stack, as shown in FIG. 5.

The crystallographic etching process can be carried out by any suitable dry and/or wet etching techniques known in the art. Preferably, but not necessarily, the crystallographic etching of the semiconductor device layer 16 is carried out by one or more wet-etching processes, which employ etching solutions such as ammonia-based etching solutions, tetramethyl ammonium hydroxide (TMAH)-based etching solutions, hydroxide-based etching solutions, ethylene diamine pyrocatechol (EDP)-based etching solutions, etc.

The wet-etching processes typically etch the semiconductor device layer 16 along all crystallographic directions, but at significantly different rates along different crystal planes or orientations. Therefore, the etch patterned formed by the crystallographic etching proceeds along the fast-etched crystal planes and is eventually terminated by the slowly-etched crystal planes. For example, an etching solution that comprises approximately 23.4% KOH, 13.3% isopropyl alcohol (IPA), and 63.3% water, when heated to about 80° C., etches the single crystal silicon at an etching rate of about 1.0 µm/minute along the {100} planes, but at an etching rate of about 0.06 µm/minute along the {110} planes. In other words, this etching solution etches the {100} planes about 17 times faster than the {110} planes. Therefore, such an etching solution can be used to etch a silicon substrate with a {100} surface to form a recess that is terminated at the {110} planes. In contrast, an etching solution that comprises approximately 44% KOH and 56% water, when heated to about 120° C., etches the single crystal silicon at an etching rate of about 11.7 µm/minute along the {110} planes, about 5.8 µm/minute along the {100} planes, and about 0.02 µm/minute along the {111} planes. In other words, this etching solution etches the {110} and {100} planes significantly faster than the {111} planes (more than 550 and 250 times faster, respectively). Therefore, such an etching solution can be used to etch a silicon substrate with a {100} or a {110} surface to form a recess that is terminated at the {111} planes.

Most preferably, the crystallographic etching of the semiconductor device layer 16 is carried out by using an aqueous etching solution that etches a silicon layer along the {110} planes much faster than the {111} planes and can therefore be used to form surface recesses with slanted sidewalls oriented along the {111} planes on a silicon semiconductor device layer with a {110} upper surface. For more details regarding the etching solution, see O. Weber et al., A Novel Locally Engineered (111) V-channel pMOSFET Architecture with Improved Drivability Characteristics for Low-Standby Power (LSTP) CMOS Applications, 2005 VLSI, p. 156.

If the crystallographic etching process proceeds in a controlled manner and is terminated within a relatively short time period (T1), the surface recesses 13 each will have a trapezoidal cross section with a relatively flat bottom surface 16C that is parallel to the upper surface 16A of the semiconductor device layer 16 and one or more sidewall surfaces 16B that are slanted or tilted away from the upper surface 16A of the semiconductor device layer 16, as shown in FIG. 5. Specifically, when the upper surface 16A of the semiconductor device layer 16 is oriented along one of the {110} planes of silicon, the sidewall surfaces 16B of the recesses 13 are oriented along the {111} planes of silicon, which are tilted or slanted in relation to the {110} crystal planes.

Figure 6:
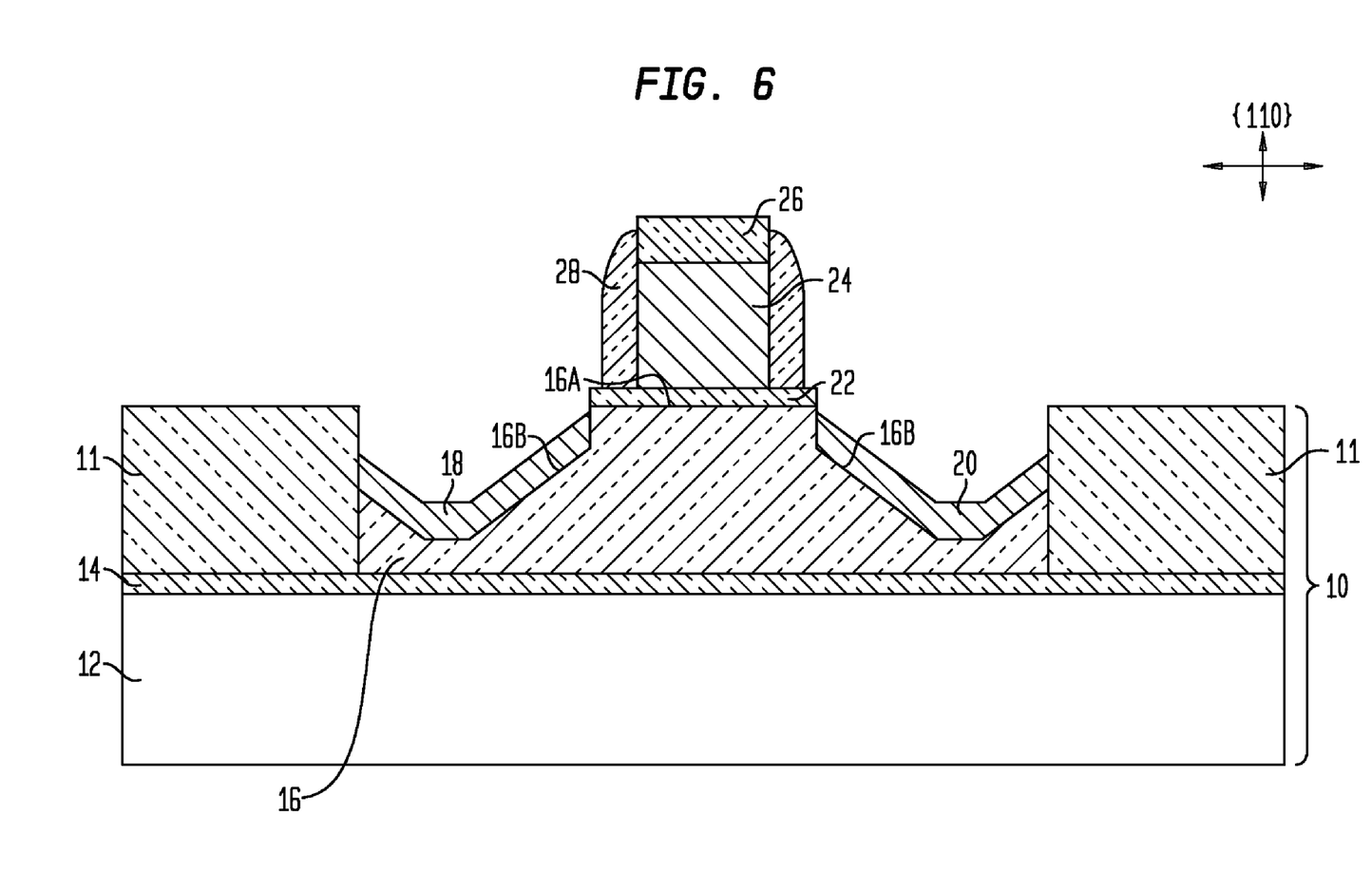

After formation of the surface recesses 13 in the semiconductor device layer 16, a second dopant implantation step can be carried out to form source and drain implantations (not shown), followed by a high temperature anneal to active the implanted dopant species. Next, a nitride RIE step can be carried out to remove the silicon nitride material from over the gate conductor 24, and a salicidation step can be subsequently carried out to form S/D metal silicide layers 18 and 20 and a gate metal silicide layer 26, as shown in FIG. 6. The S/D implantation, the nitride RIE and the salicidation steps are well known in the art and are therefore not described herein.

A stress-inducing dielectric layer 30 is then deposited over the entire structure to form a complete MOSFET as shown in FIG. 1. The stress-inducing dielectric layer 30 preferably comprises tensilely or compressively stressed silicon nitride, which can be readily formed by any suitable dielectric deposition method. Specifically, a compressively or tensilely stressed silicon nitride layer can be formed by, for example, a low pressure chemical vapor deposition (LPCVD) process or a plasma enhanced chemical vapor deposition (PECVD) process, as disclosed by U.S. Patent Application Publication No. 2003/0040158 or by A. Tarraf et al., "Stress Investigation of PECVD Dielectric Layers for Advanced Optical MEMS," J. MICROMECH. MICROENG., Vol. 14, pp. 317-323 (2004), or by any other suitable deposition techniques well known in the art, such as, for example, high density plasma (HDP) deposition technique. Preferably, the compressively or tensilely stressed silicon nitride layer has a thickness ranging from about 10 nm to about 500 nm, more preferably from about 20 nm to about 200 nm, and most preferably from about 40 nm to about 100 nm.

Figure 7:
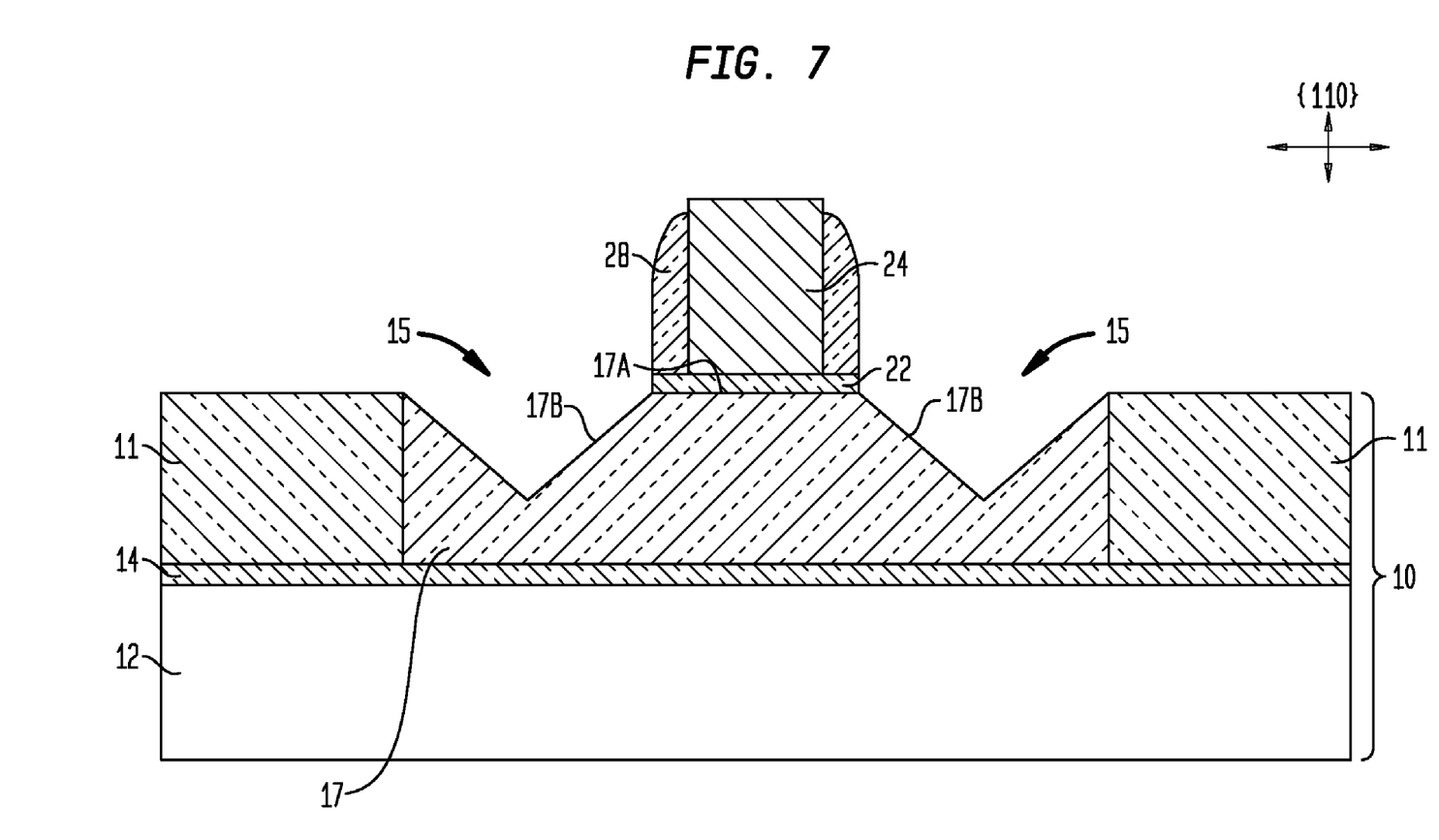
FIGS. 7-8 are cross-sectional views that illustrate exemplary processing steps for forming the improved MOSFET device of FIG. 2, according to one embodiment of the present invention.

If the crystallographic etching process as mentioned hereinabove is allowed to proceed for relatively long period of time (T2, where T2>T1), surface recesses 15 as shown in FIG. 7 can be formed in a semiconductor device layer 17 that has an upper surface 17A. Specifically, the surface recesses 15 each has a triangular (instead of trapezoidal) cross section with sidewall surfaces 17B that are slanted or tilted away from an upper surface 17A of the semiconductor device layer 17, without any flat bottom surface, as shown in FIG. 7. Specifically, when the upper surface 17A of the semiconductor device layer 17 is oriented along one of the {110} planes of silicon, the sidewall surfaces 17B of the recesses 15 are oriented along the {111} planes of silicon, which are tilted or slanted in relation to the {110} crystal planes. The same etching solution as mentioned hereinabove can be used for forming the triangular recesses 15, except that the etching is allowed to proceed for a relatively long period of time (T2).

Figure 8:
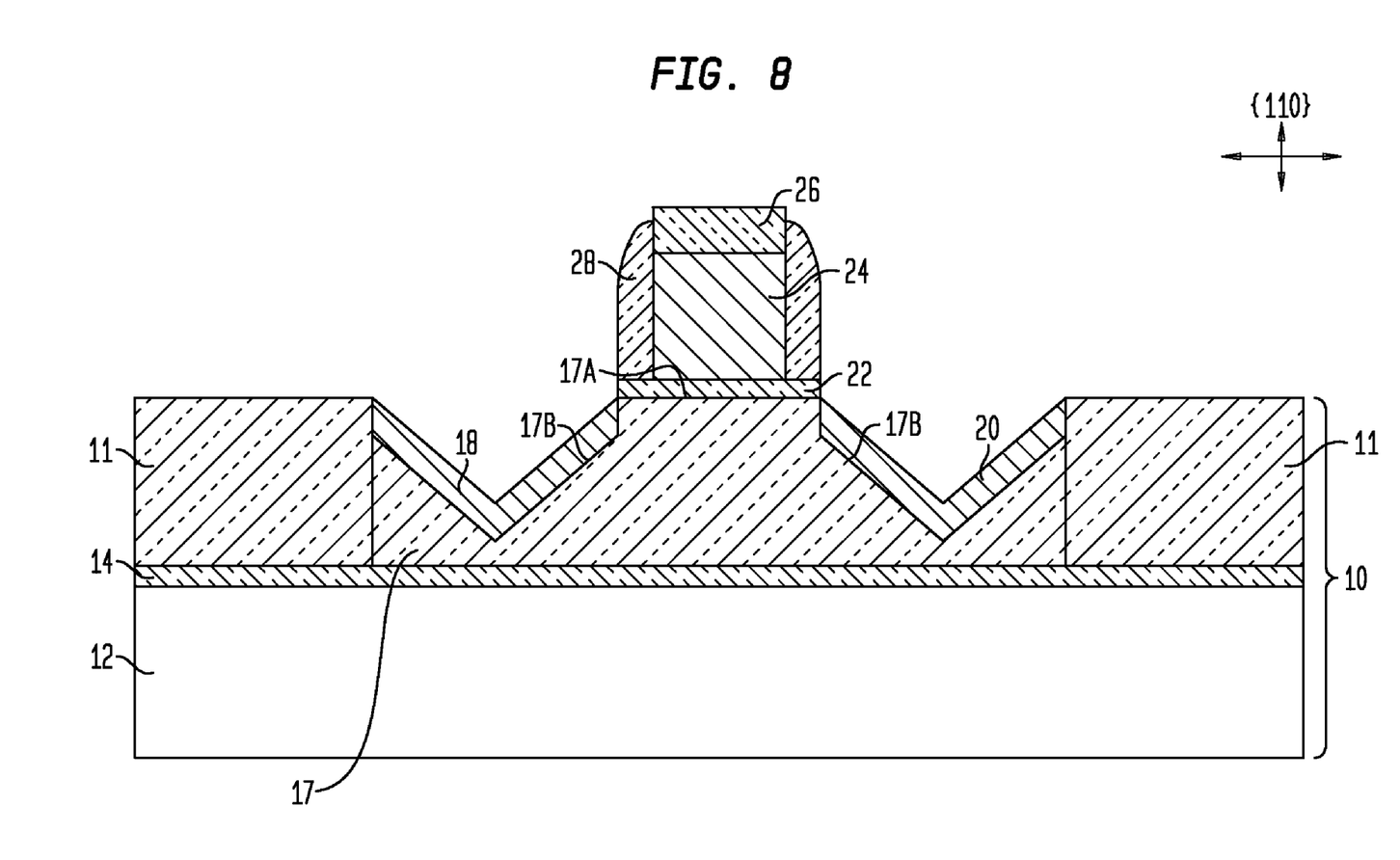

After formation of the surface recesses 15 in the semiconductor device layer 17, S/D dopant implantation, nitride RIE, and salicidation, as described hereinabove, can be carried out to form the source and drain implantations (not shown), the S/D metal silicide layers 18 and 20, and the gate metal silicide layer 26, as shown in FIG. 8. Subsequently, a stress-inducing dielectric layer 30 is deposited over the entire structure to form a complete MOSFET as shown in FIG. 2.

Note that while FIGS. 1-8 illustratively demonstrate exemplary MOSFET device structures and exemplary processing steps for forming such device structures, according to specific embodiments of the present invention, it is clear that a person ordinarily skilled in the art can readily modify such a device structure and processing steps for adaptation to specific application requirements, consistent with the above descriptions. For example, while the semiconductor substrates shown in FIGS. 1-8 represent semiconductor-on-insulator (SOI) substrates, it should be appreciated that bulk semiconductor substrates can also be used for practice of the present application. Further, while the {110} and {111} crystal planes of single crystal silicon are primarily illustrated by FIGS. 1-8, other suitable crystal planes, such as the {100}, {111}, {211}, {311}, {511}, and {711} planes of single crystal silicon, can also be used in any suitable combination in the present invention, consistent with the spirit and principles described hereinabove.

It is noted that the drawings of the present invention are provided for illustrative purposes and are not drawn to scale.

While the invention has been described herein with reference to specific embodiments, features and aspects, it will be recognized that the invention is not thus limited, but rather extends in utility to other modifications, variations, applications, and embodiments, and accordingly all such other modifications, variations, applications, and embodiments are to be regarded as being within the spirit and scope of the invention.

What is claimed is:

1. A semiconductor device comprising:
a metal-oxide-semiconductor field effect transistor (MOSFET) including source and drain regions located in a semiconductor substrate, the source and drain regions separated by a channel of the MOSFET, a gate structure including at least one spacer abutting the gate structure, said source and drain regions comprise recesses with one or more sidewall surfaces that are slanted in relation to an upper surface of said semiconductor substrate, the entire recesses being separated from a portion of the semiconductor substrate underlying the gate structure by another portion of the semiconductor substrate underlying the at least one spacer, and wherein a stress-inducing dielectric layer located over said one or more slanted sidewall surfaces of said recesses at said source and drain regions, wherein a portion of stress-inducing dielectric layer is located within said semiconductor substrate beneath a level of said upper surface of said semiconductor substrate and applies stress to the channel of said MOSFET.

2. The semiconductor device of claim 1, wherein the stress-inducing dielectric layer comprises tensilely or compressively stressed silicon nitride.

3. The semiconductor device of claim 1, wherein the upper surface of the semiconductor substrate is oriented along one of a first set of equivalent crystal planes, and wherein the one or more sidewall surfaces of the recesses are oriented along a second, different set of equivalent crystal planes.

4. The semiconductor device of claim 3, wherein the semiconductor substrate comprises single crystal silicon, and wherein the first and second sets of equivalent crystal planes are selected from the group consisting of the {100}, {110}, and {111} planes of silicon.

5. The semiconductor device of claim 4, wherein the MOSFET is a p-channel MOSFET, wherein the upper surface of the semiconductor substrate is oriented along one of the {110} planes of silicon, and wherein the one or more sidewall surfaces of the recesses are oriented along the {111} planes of silicon.

6. The semiconductor device of claim 4, wherein the MOSFET is an n-channel MOSFET, wherein the upper surface of the semiconductor substrate is oriented along one of the {100} planes of silicon, and wherein the one or more sidewall surfaces of the recesses are oriented along the {111} planes of silicon.

7. The semiconductor device of claim 1, wherein each of the recesses has a trapezoidal cross-section with a bottom surface that is parallel to the upper surface of the semiconductor substrate.

8. The semiconductor device of claim 1, wherein each of the recesses has a triangular cross-section without any bottom surface.

9. The semiconductor device of claim 1, wherein said source and drain regions of said MOSFET further comprise metal silicide layers located over said slanted sidewall surfaces of said recesses and underneath said stress-inducing dielectric layer.

10. The semiconductor device of claim 1, wherein the semiconductor substrate has a semiconductor-on-insulator (SOI) configuration and comprises a base semiconductor substrate layer, a buried insulator layer, and a semiconductor device layer, and wherein the recesses are located in the semiconductor device layer.

11. The semiconductor device of claim 1, wherein the semiconductor substrate comprises a bulk semiconductor structure.

* * * * *